United States Patent
Kim

(10) Patent No.: US 10,572,134 B2
(45) Date of Patent: *Feb. 25, 2020

(54) METHOD AND SYSTEM FOR PROVIDING PROTOTYPING TOOL, AND NON-TRANSITORY COMPUTER-READABLE RECORDING MEDIUM

(71) Applicant: STUDIO XID KOREA INC., Seoul (KR)

(72) Inventor: Soo Kim, Hwaseong-si (KR)

(73) Assignee: STUDIO XID KOREA INC., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/058,917

(22) Filed: Aug. 8, 2018

(65) Prior Publication Data

US 2018/0349013 A1 Dec. 6, 2018

Related U.S. Application Data

(63) Continuation of application No. 15/599,758, filed on May 19, 2017, now Pat. No. 10,067,664, which is a (Continued)

(30) Foreign Application Priority Data

Nov. 21, 2014 (KR) .................. 10-2014-0163810
Nov. 21, 2014 (KR) .................. 10-2014-0163827

(51) Int. Cl.
*G06F 3/033* (2013.01)
*G06F 3/0484* (2013.01)
(Continued)

(52) U.S. Cl.
CPC .......... *G06F 3/04847* (2013.01); *G06F 3/017* (2013.01); *G06F 3/0482* (2013.01);
(Continued)

(58) Field of Classification Search
CPC combination set(s) only.
See application file for complete search history.

(56) References Cited

U.S. PATENT DOCUMENTS 8,448,083 B1 5/2013 Migos et al.
9,081,579 B2 * 7/2015 Sharrma .................. G06F 8/38
(Continued)

FOREIGN PATENT DOCUMENTS

KR 10-2012-0106608 A 9/2012
WO 2011/026186 A1 3/2011
WO 2013/035965 A1 3/2013

OTHER PUBLICATIONS

International Search Report issued in PCT/KR2015/001870; dated Jul. 30, 2015.
(Continued)

*Primary Examiner* — Hien L Duong
(74) *Attorney, Agent, or Firm* — Studebaker & Brackett PC

(57) ABSTRACT

The present disclosure provides a method for providing a prototyping tool, including at least: acquiring input data from a user; defining, as a trigger, a gesture generated by using the input data; and defining an interaction for allowing at least one action to be performed if the trigger occurs.

17 Claims, 16 Drawing Sheets

Related U.S. Application Data continuation of application No. PCT/KR2015/001870, filed on Feb. 26, 2015.

(51) Int. Cl.
*G06F 3/0488* (2013.01)
*G06F 8/34* (2018.01)
*G06F 3/01* (2006.01)
*G06F 3/0482* (2013.01)
*G06F 3/0486* (2013.01)
*G06F 17/50* (2006.01)

(52) U.S. Cl.
CPC .......... *G06F 3/0486* (2013.01); *G06F 3/0488* (2013.01); *G06F 8/34* (2013.01); *G06F 17/50* (2013.01)

(56) References Cited

U.S. PATENT DOCUMENTS

| | | | |
|---|---|---|---|
| 9,720,594 B2 | 8/2017 | Beaver et al. | |
| 9,733,716 B2 | 8/2017 | Shaffer | |
| 2010/0207950 A1* | 8/2010 | Zhao | G06T 13/00 345/473 |
| 2011/0035706 A1* | 2/2011 | Kinoshita | G06F 8/38 715/835 |
| 2011/0102464 A1 | 5/2011 | Godavari | |
| 2011/0179387 A1 | 7/2011 | Shaffer et al. | |
| 2012/0058783 A1 | 3/2012 | Kim et al. | |
| 2012/0299852 A1 | 11/2012 | Hsu et al. | |
| 2013/0030815 A1 | 1/2013 | Madhvanath et al. | |
| 2013/0111395 A1 | 5/2013 | Ying et al. | |
| 2013/0201113 A1* | 8/2013 | Hinckley | G06F 3/0487 345/173 |
| 2013/0201115 A1 | 8/2013 | Heubel | |
| 2013/0275888 A1 | 10/2013 | Williamson et al. | |
| 2014/0055426 A1 | 2/2014 | Park et al. | |
| 2014/0250392 A1* | 9/2014 | Riggins | H04N 21/8545 715/764 |
| 2014/0298266 A1 | 10/2014 | Lapp | |
| 2014/0370937 A1 | 12/2014 | Park et al. | |
| 2015/0339033 A1 | 11/2015 | Arnold et al. | |
| 2016/0018981 A1 | 1/2016 | Amerige et al. | |
| 2016/0170635 A1 | 6/2016 | Iwaizumi et al. | |

OTHER PUBLICATIONS

An Office Action mailed by the State Intellectual Property Office of the People's Republic of China dated Sep. 11, 2019, which corresponds to Chinese Patent Application No. 201580063397.1 and is related to U.S. Appl. No. 16/058,917.

Hongting Li, "Research Methods on Usability of Products", Fudan University Press, Dec. 31, 2013, pp. 153-160, Shanghai, China.

\* cited by examiner

Trigger

Action

METHOD AND SYSTEM FOR PROVIDING PROTOTYPING TOOL, AND NON-TRANSITORY COMPUTER-READABLE RECORDING MEDIUM

CROSS-REFERENCE TO RELATED APPLICATIONS

The present application is a continuation of U.S. application Ser. No. 15/599,758, filed May 19, 2017, which is a continuation of International Patent Application No. PCT/KR2015/001870, filed Feb. 26, 2015, which is based upon and claims the benefit of priority to Korean Patent Application Nos. 10-2014-0163810, filed on Nov. 21, 2014, and 10-2014-0163827, filed on Nov. 21, 2014. The disclosure of the above-listed applications is hereby incorporated by reference herein in its entirety.

TECHNICAL FIELD

The present disclosure relates to a method and system for providing a prototyping tool, and a non-transitory computer-readable recording medium.

BACKGROUND ART

In recent years, smart devices, wearable devices, and Internet of Things (IoT) devices have been widely used, and technologies relating to an interaction for controlling these devices have been actively developed. In conventional techniques relating to the interaction, control is performed on a device mainly based on a general and regular gesture such as a touch gesture (e.g., tap or swipe) inputted through a touch panel or a motion gesture (e.g., shake or rotate) inputted through an acceleration sensor or a gyro sensor.

However, in the case of a device, such as a wearable device or an IoT device, which is difficult to include a touch panel, or a device which is difficult to include an acceleration sensor or a gyro sensor due to restrictions in shape or manufacturing cost, there is a limitation that it is difficult to apply the conventional interaction techniques based on a general and regular gesture.

Therefore, a technique is required to support the definition of a new gesture according to the characteristics of a device to be controlled or the situation in which it is being used, or support more specific control of a device by combining two or more gestures.

Meanwhile, interest in a prototyping tool necessary for developing the above-mentioned interaction techniques is also increasing. Conventionally, various prototyping tools have been introduced to support the development of computer programs such as applications and interaction techniques applicable to the computer programs. However, the conventional prototyping tool has a problem in that it is difficult for a general user (e.g., an app designer) who does not have background knowledge about computer programming to use the prototyping tool, or has a limitation that although it is easy for a general user to use the prototyping tool, its functionality is limited, making it difficult to implement a sophisticated and complex interaction desired by the user.

Therefore, there is a need for a prototyping tool for supporting the implementation of a sophisticated and complex interaction while enabling the elements constituting the interaction to be easily defined and combined.

One object of the present disclosure is to solve all the above-described problems.

SUMMARY

In order to accomplish the above objects, a representative configuration of the present disclosure is as follows.

According to an aspect of the present disclosure, there is provided a method for providing a prototyping tool, comprising: acquiring input data from a user; defining, as a trigger, a gesture generated by using the input data; and defining an interaction for allowing at least one action to be performed if the trigger occurs.

According to another aspect of the present disclosure, there is provided a non-transitory computer readable medium storing a computer program causing a computer to provide a prototyping tool. The computer program comprising: an instruction of acquiring input data from a user; an instruction of defining, as a trigger, a gesture generated by using the input data; and an instruction of defining an interaction for allowing at least one action to be performed if the trigger occurs.

DETAILED DESCRIPTION

Figure 1:
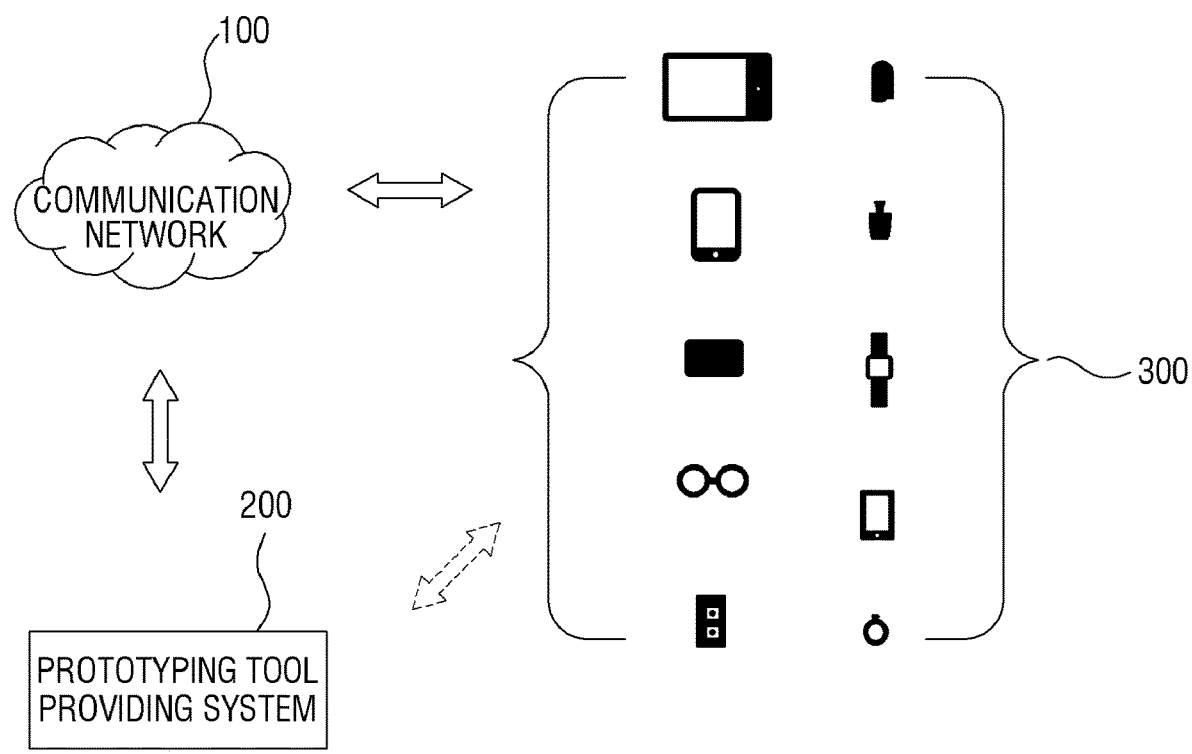
FIG. 1 is a diagram showing a schematic configuration of an entire system for providing a prototyping tool according to an embodiment of the present disclosure.

One object of the present disclosure is to provide a prototyping tool for supporting the implementation of a sophisticated and complex interaction while enabling the elements constituting the interaction to be easily defined and combined, by acquiring first input data and second input data using at least one sensor; acquiring combination data for specifying a combination between the first input data and the second input data; defining, as a trigger, a gesture in which the first input data and the second input data are combined according to the combination data; providing a first graphic element corresponding to a trigger, a second graphic element corresponding to an object, and a third graphic element corresponding to an action; and defining, when at least one first graphic element, at least one second graphic element and at least one third graphic element are selected and combined by a user, an interaction for allowing at least one action corresponding to the at least one third graphic element to be performed with respect to at least one object corresponding to the at least one second graphic element if at least one trigger corresponding to the at least one first graphic element occurs.

According to the present disclosure, an effect is achieved that a user can easily and variously generate a gesture that can be utilized as a trigger of an interaction applied to a smart device, a wearable device, an IoT device, or the like.

Further, according to the present disclosure, an effect is achieved that even a user who does not have technical background knowledge required to implement an interaction can easily prototype various interactions.

In the following detailed description of the present disclosure, references are made to the accompanying drawings that show, by way of illustration, specific embodiments in which the disclosure may be practiced. These embodiments are described in sufficient detail to enable those skilled in the art to practice the disclosure. It is to be understood that the various embodiments of the disclosure, although different from each other, are not necessarily mutually exclusive. For example, specific shapes, structures, or characteristics described herein may be implemented as modified from one embodiment to another embodiment without departing from the spirit and the scope of the disclosure. Furthermore, it shall be understood that the locations or arrangements of individual elements within each embodiment may be also modified without departing from the spirit and the scope of the disclosure. Therefore, the following detailed description is not to be taken in a limiting sense, and the scope of the disclosure is to be taken as encompassing the scope of the appended claims and all equivalents thereof. In the drawings, like reference numerals refer to the same or similar elements throughout the several views.

Hereinafter, various preferred embodiments of the present disclosure will be described in detail with reference to the accompanying drawings to enable those skilled in the art to easily implement the disclosure.

As used herein, the term "interaction" is a concept that collectively refers to interactions that may occur between a user and a device 300, and may include an action indicating an operation performed in the device and a trigger acting as a triggering event that triggers a specific action, and an object serving as a target of the action or trigger.

Configuration of the Entire System

FIG. 1 is a diagram showing a schematic configuration of an entire system for providing a prototyping tool according to an embodiment of the present disclosure.

As shown in FIG. 1, an entire system according to an embodiment of the present disclosure may include a communication network 100, a prototyping tool providing system 200, and devices 310 and 320.

First, the communication network 100 according to an embodiment of the present disclosure may be configured regardless of a communication mode such as wired communication and wireless communication, and may include various communication networks such as a local area network (LAN), a metropolitan area network (MAN) and a wide area network (WAN). Preferably, the communication network 100 used herein may be the well-known Internet or World Wide Web (WWW). However, the communication network 100 may include, at least in part, a known wired or wireless data communication network, a known telephone network, or a known wired or wireless television communication network, without being limited thereto.

Next, the prototyping tool providing system 200 according to an embodiment of the present disclosure may be a digital device having a memory means and a microprocessor for a computation function. The prototyping tool providing system 200 may be a server system.

To this end, the prototyping tool providing system 200, as described in detail below, may perform a function of providing a prototyping tool for supporting the implementation of a sophisticated and complex interaction while enabling the elements constituting the interaction to be easily defined and combined, by acquiring first input data and second input data using at least one sensor; acquiring combination data for specifying a combination between the first input data and the second input data; defining, as a trigger, a gesture in which the first input data and the second input data are combined according to the combination data; providing a first graphic element corresponding to a trigger, a second graphic element corresponding to an object, and a third graphic element corresponding to an action; and defining, when at least one first graphic element, at least one second graphic element and at least one third graphic element are selected and combined by a user, an interaction for allowing at least one action corresponding to the at least one third graphic element to be performed with respect to at least one object corresponding to the at least one second graphic element if at least one trigger corresponding to the at least one first graphic element occurs.

The function of the prototyping tool providing system 200 will be described in more detail below. Although the above description has been made with respect to the prototyping tool providing system 200, the description is exemplary and it will be apparent to those skilled in the art that at least some of the functions or components required for the prototyping tool providing system 200 may be realized or included in the devices 310 and 320 that are subject to interaction prototyping as needed.

Next, each of the devices 310 and 320 according to an embodiment of the present disclosure is a digital device including a function capable of performing communication after being connected to the prototyping tool providing system 200 or a counterpart of the devices 310 and 320 (preferably, the devices 310 and 320 may be separate from each other or externalized). Any digital device having a memory means and a microprocessor for a computation function may be employed as each of the devices 310 and 320 according to the present disclosure. The devices 310 and 320 may be so-called smart devices such as smart phones and smart pads, so-called wearable devices such as smart glasses, smart watches, smart bands and smart rings, or Internet of Things (IoT) devices. The devices 310 and 320 may also be relatively conventional devices such as desktop computers, laptop computers, workstations, PDAs, web pads, mobile phones, buttons, mouses, keyboards, and electronic pens.

In particular, according to an embodiment of the present disclosure, the devices 310 and 320 may include at least one technical means (i.e., a sensor) capable of obtaining input data or combination data according to a user's operation. Examples of the technical means may include well-known components such as a touch panel and a pointing tool (e.g., a mouse, a stylus and an electronic pen), a graphic object which can be operated by a user, a keyboard, a toggle switch, a biometric information (e.g., fingerprint) recognition sensor, a distance sensor, a motion sensor, an acceleration sensor, a gyro sensor, a magnetic sensor, a positioning sensor (e.g., a GPS module and a beacon-based positioning (checking) module), an atmospheric pressure sensor, a distance sensor, an image sensor (e.g., a camera), an acoustic sensor, a voice recognition sensor, an optical sensor and the like.

In addition, the devices 310 and 320 may further include an application program for allowing an interaction prototyped by the prototyping tool providing system 200 to be performed on the device or supporting the prototyping itself. Such an application may exist in the form of a program module within the devices 310 and 320. The program module may be generally similar to the internal components of the prototyping tool providing system 200 as described above. Here, an application may be replaced with a hardware device or a firmware device, at least a part of which may perform substantially the same or equivalent functions as necessary.

Meanwhile, according to an embodiment of the present disclosure, if it is recognized that the first device 310 and the second device 320 have a predetermined association (for example, belonging to the same user, functioning for the same user, substantially close to each other, or reasonable for one of them to authenticate or allow the other), a predetermined connection may be formed between the first device 310 and the second device 320. This recognition or connection may be performed by the prototyping tool providing system 200 or directly by the first device 310 and the second device 320.

Configuration of the Prototyping Tool Providing System

Hereinafter, an internal configuration of the prototyping tool providing system which performs an important function for the implementation of the present disclosure and the functions of the respective components will be described.

Figure 2:
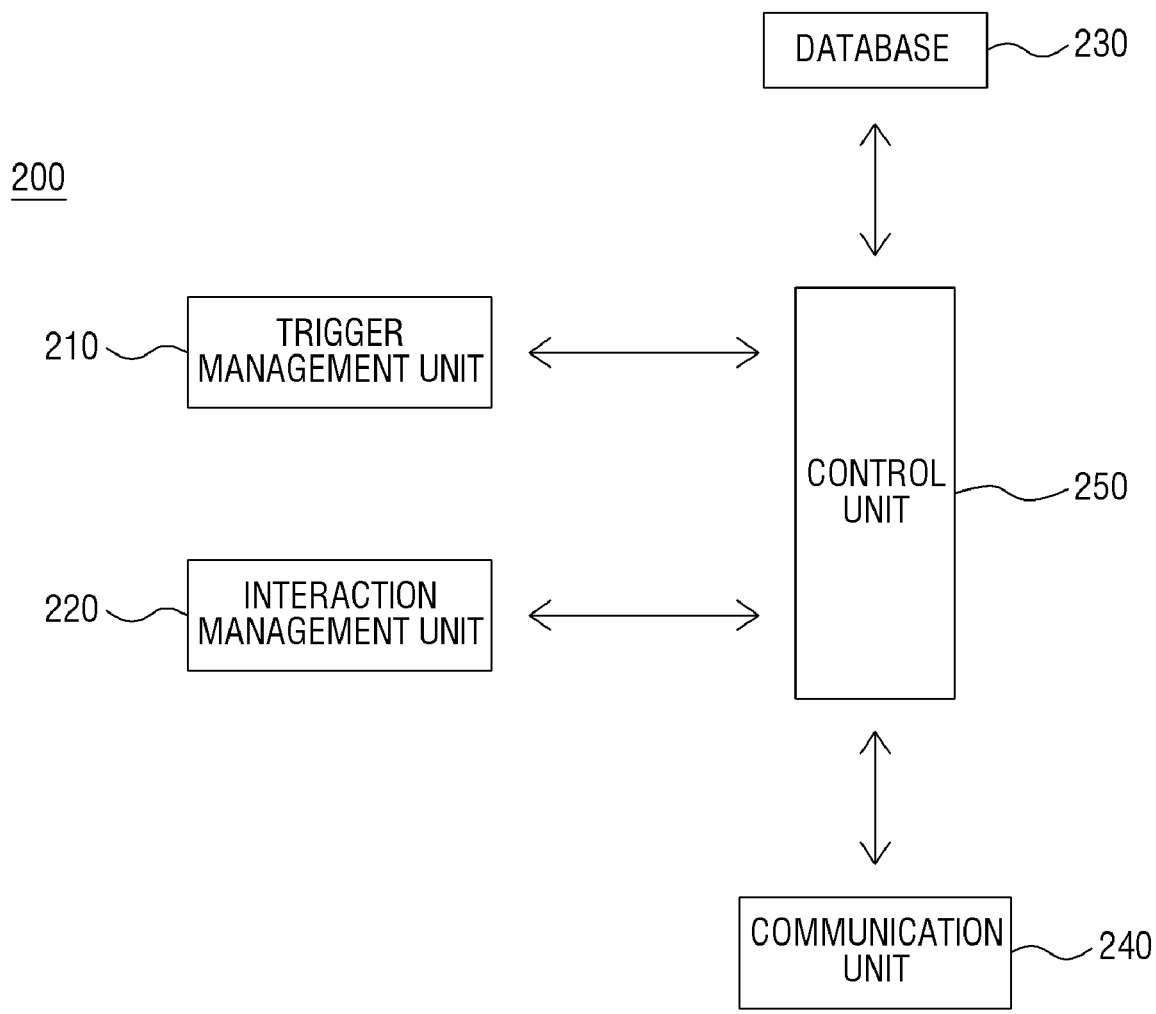
FIG. 2 is a diagram illustrating an exemplary internal configuration of a prototyping tool providing system according to an embodiment of the present disclosure.

FIG. 2 is a diagram illustrating an exemplary internal configuration of the prototyping tool providing system according to an embodiment of the present disclosure.

Referring to FIG. 2, the prototyping tool providing system 200 according to an embodiment of the present disclosure may include a trigger management unit 210, an interaction management unit 220, a database 230, a communication unit 240, and a control unit 250. According to an embodiment of the present disclosure, at least some of the trigger management unit 210, the interaction management unit 220, the database 230, the communication unit 240 and the control unit 250 may be program modules which communicate with an external system (not shown). The program modules may be included in the prototyping tool providing system 200 in the form of operating systems, application program modules, and other program modules, and may be physically stored in various known storage devices. These program modules may also be stored in a remote storage device capable of communicating with the prototyping tool providing system 200. Meanwhile, these program modules may encompass routines, subroutines, programs, objects, components, data structures, etc., that execute a particular abstract data type or perform a particular task, which will be described later in accordance with the present disclosure, but are not limited thereto.

First, according to an embodiment of the present disclosure, the trigger management unit 210 may perform a function of acquiring first input data and second input data using at least one sensor, and acquiring combination data for specifying a combination between the first input data and the second input data. Further, according to an embodiment of the present disclosure, the trigger management unit 210 may perform a function of defining, as a trigger, a gesture in which the first input data and the second input data are combined according to the acquired combination data.

Specifically, according to an embodiment of the present disclosure, the trigger management unit 210 may sequentially acquire the first input data and the second input data at a predetermined time interval.

Further, according to an embodiment of the present disclosure, in acquiring the first input data or the second input data, the trigger management unit 210 may specify the first input data or the second input data by detecting a demonstration performed by the user using at least one sensor after receiving a selection of the type of the input data from the user. However, the method of acquiring the input data according to the present disclosure is not necessarily limited to the above-described method, and the input data may be specified only by detecting a demonstration performed by the user using at least one sensor in a state in which a selection of the type of the input data is not separately received from the user.

Further, according to an embodiment of the present disclosure, the trigger management unit 210 may specify the first input data or the second input data by detecting a demonstration performed over a plurality of devices.

In addition, according to an embodiment of the present disclosure, the trigger management unit 210 may specify the first input data or the second input data based on a pattern extracted from the demonstration that is detected a plurality of times.

In addition, according to an embodiment of the present disclosure, the combination data acquired by the trigger management unit 210 may include a Boolean operator. For example, the combination data may include an AND operator, an OR operator, a NOT operator, an exclusive-OR (XOR) operator, and the like.

Figure 3A:
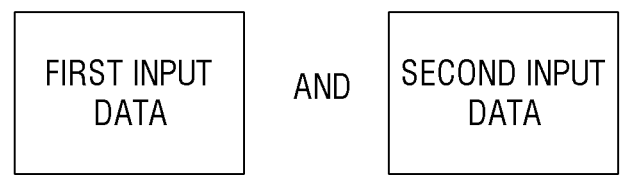
FIGS. 3A and 3B are diagrams illustrating configurations in which the input data are combined according to the combination data according to an embodiment of the present disclosure.
Figure 3B:
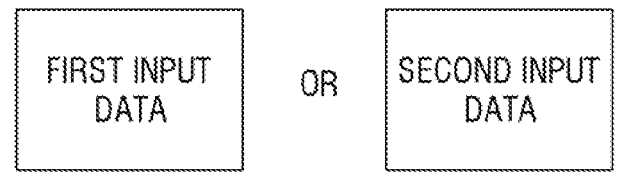

FIGS. 3A and 3B are diagrams illustrating a configuration in which the input data are combined according to the combination data according to an embodiment of the present disclosure.

Referring to FIG. 3A, it may be assumed that the first input data and the second input data are combined according to the combination data called an AND operator. In this case, a gesture in which both the first input data and the second input data are inputted may be defined as a trigger. Referring to FIG. 3B, it may be assumed that the first input data and the second input data are combined according to the combination data called an OR operator. In this case, a gesture in which either the first input data or the second input data is inputted may be defined as a trigger.

Figure 4:
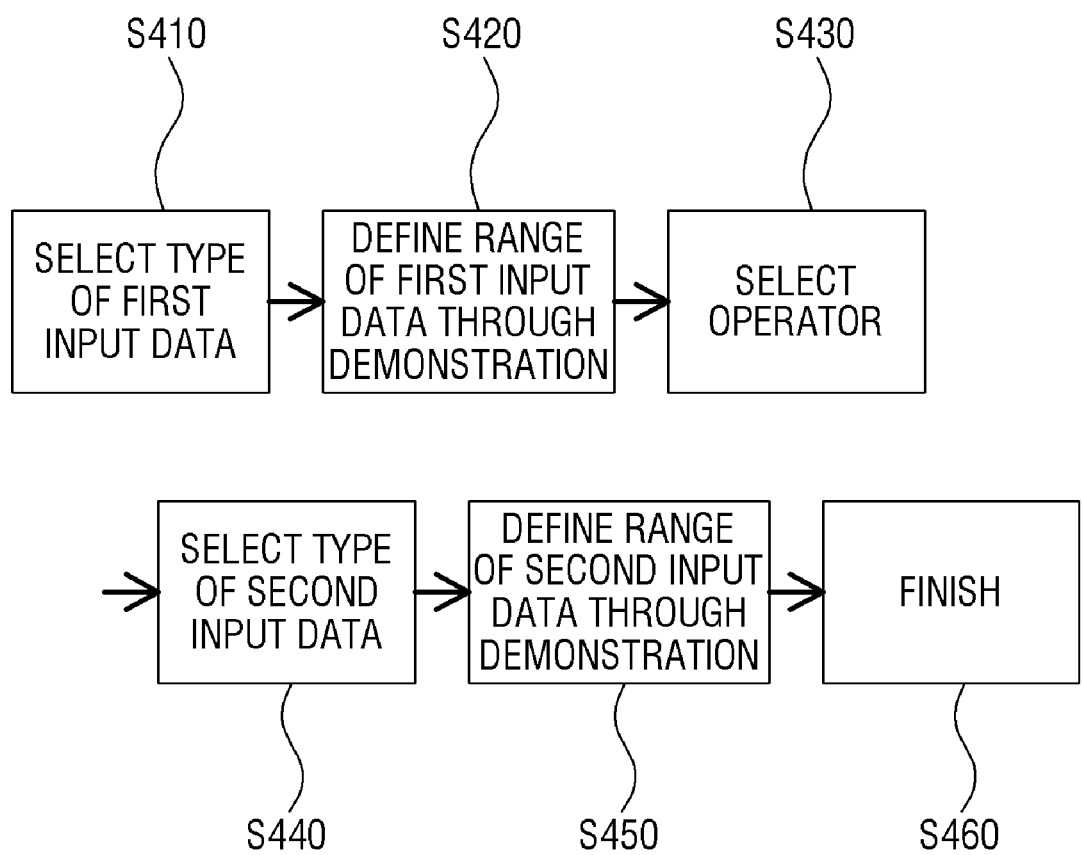
FIG. 4 is a diagram illustrating a process of defining a trigger according to an embodiment of the present disclosure.

FIG. 4 is a diagram illustrating a process of defining a trigger according to an embodiment of the present disclosure.

Referring to FIG. 4, first, the user may select a type of the first input data (e.g., a device tilt) (S410), and specify a range of the first input data (e.g., a range of an angle at which the device is tilted) by performing a demonstration corresponding to the selected type with respect to the device 300 (S420). Then, the user may select the combination data for specifying a combination between the first input data acquired earlier and the second input data to be acquired subsequently (S430). Then, the user may select a type of the second input data (e.g., a device shake) (S440), and specify a range of the second input data (e.g., an acceleration and a distance at which the device is shaken) by performing a demonstration corresponding to the selected type with respect to the device 300 (S450). Then, a gesture generated as a result of combining the acquired first input data and second input data according to the combination data may be defined as a trigger (S460).

Meanwhile, according to an embodiment of the present disclosure, the trigger management unit 210 may determine that only the input data approved by the user among the acquired input data is valid input data. Also, according to an embodiment of the present disclosure, the trigger management unit 210 may determine that only the gesture approved by the user among the generated gestures is a valid trigger. That is, according to an embodiment of the present disclosure, if the acquired first input data or second input data is erroneously inputted due to the user's demonstration mistake or the like, or if the gesture generated as a result of combining the acquired first input data and second input data does not match the user's intention, the user may cancel the corresponding input data or the corresponding gesture so that only the input data or gesture intended by the user can be included in the trigger.

Next, according to an embodiment of the present disclosure, the interaction management unit 220 may perform a function of providing a first graphic element corresponding to a trigger, a second graphic element corresponding to an object, and a third graphic element corresponding to an action. Further, according to an embodiment of the present disclosure, the interaction management unit 220 may perform a function of defining, when at least one first graphic element, at least one second graphic element and at least one third graphic element are selected and combined by the user, an interaction for allowing at least one action corresponding to the selected third graphic element to be performed with respect to at least one object corresponding to the selected second graphic element if at least one trigger corresponding to the selected first graphic element occurs.

Here, according to an embodiment of the present disclosure, an object may include any kind of object that can be controlled by or interacted with the device, as well as a text, an image, a video, an audio, a character, an avatar, the whole area of the screen, a partial area of the screen, and the like.

Further, according to an embodiment of the present disclosure, an action may include any kind of action that can be performed on an object in the device, as well as Move, Rotate, Scale, Opacity, Color, Run, Cancel, Copy, Paste, Delete, Scroll, and the like.

Specifically, according to an embodiment of the present disclosure, the interaction management unit 220 may perform a function of providing a graphical user interface (GUI) for supporting the user's selection and combination of at least one first graphic element corresponding to a trigger, at least one second graphic element corresponding to an object, and at least one third graphic element corresponding to an action.

Figure 5A:
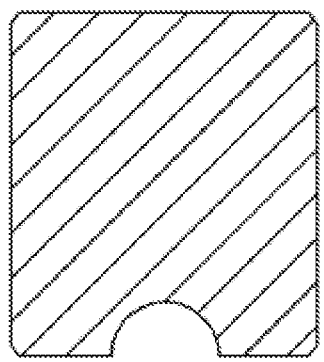
FIGS. 5A and 5B are diagrams illustrating exemplary configurations of graphic elements according to an embodiment of the present disclosure.
Figure 5B:
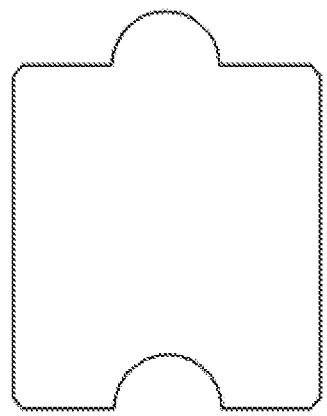

FIGS. 5A and 5B are diagrams illustrating an exemplary configuration of graphic elements according to an embodiment of the present disclosure.

Referring to FIGS. 5A and 5B, the first graphic element, the second graphic element and the third graphic element corresponding to a trigger, an object and an action respectively may be formed into a shape of pieces constituting a jigsaw puzzle, and these graphic elements may be combined in the up, down, left and right directions according to joints formed at boundaries.

For example, the first graphic element corresponding to a trigger may be formed in such a shape as to be connected to another graphic element only downward, so that the first graphic element can be disposed on top of the set of graphic elements defining the interaction (see FIG. 5A). Further, the third graphic element corresponding to an action may be formed in such a shape as to be connected to another graphic element both upward and downward, so that the third graphic element can be disposed below the first graphic element or above or below another the second graphic element within the set of graphic elements defining the interaction (see FIG. 5B). In addition, the second graphic element corresponding to an object may be formed in such a shape as to at least partially overlap with the first graphic element or the third graphic element, so that it can be visually represented that an object is associated with a trigger or an action.

Figure 6A:
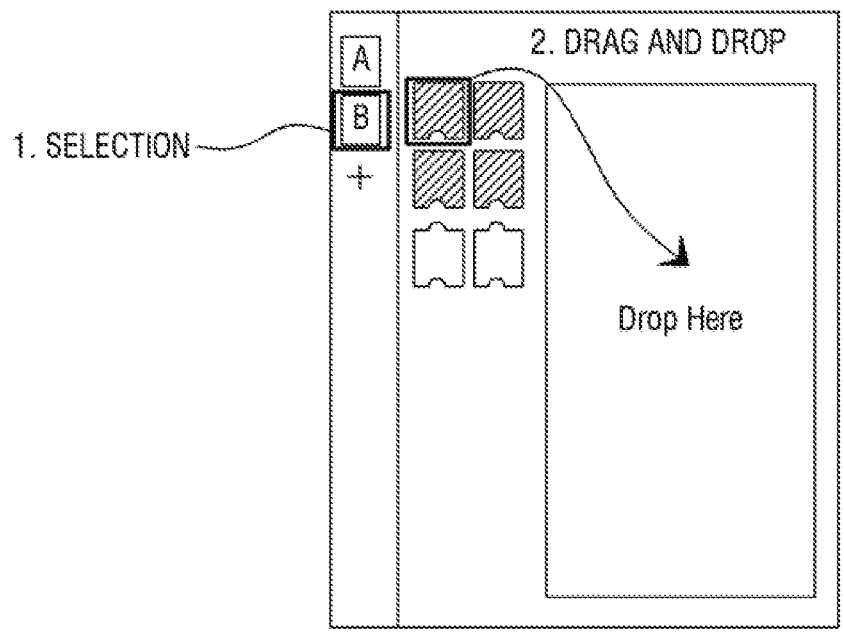
FIGS. 6A, 6B and 7 illustrate configurations for defining an interaction for allowing an action associated with a predetermined object to be performed when a trigger associated with a predetermined object occurs, according to an embodiment of the present disclosure.
Figure 6B:
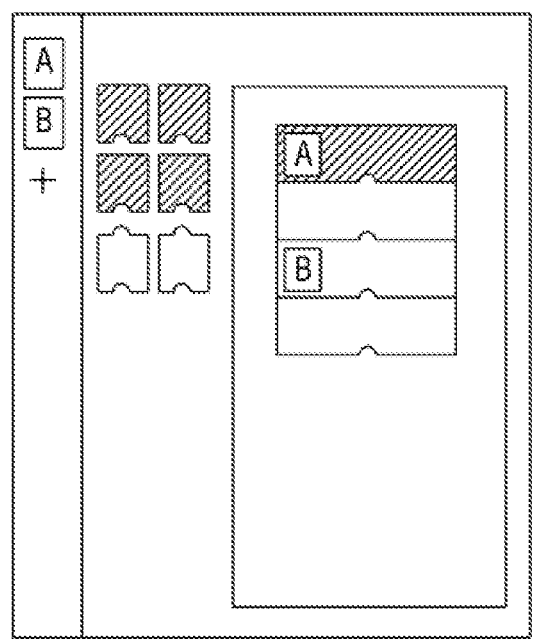
Figure 7:
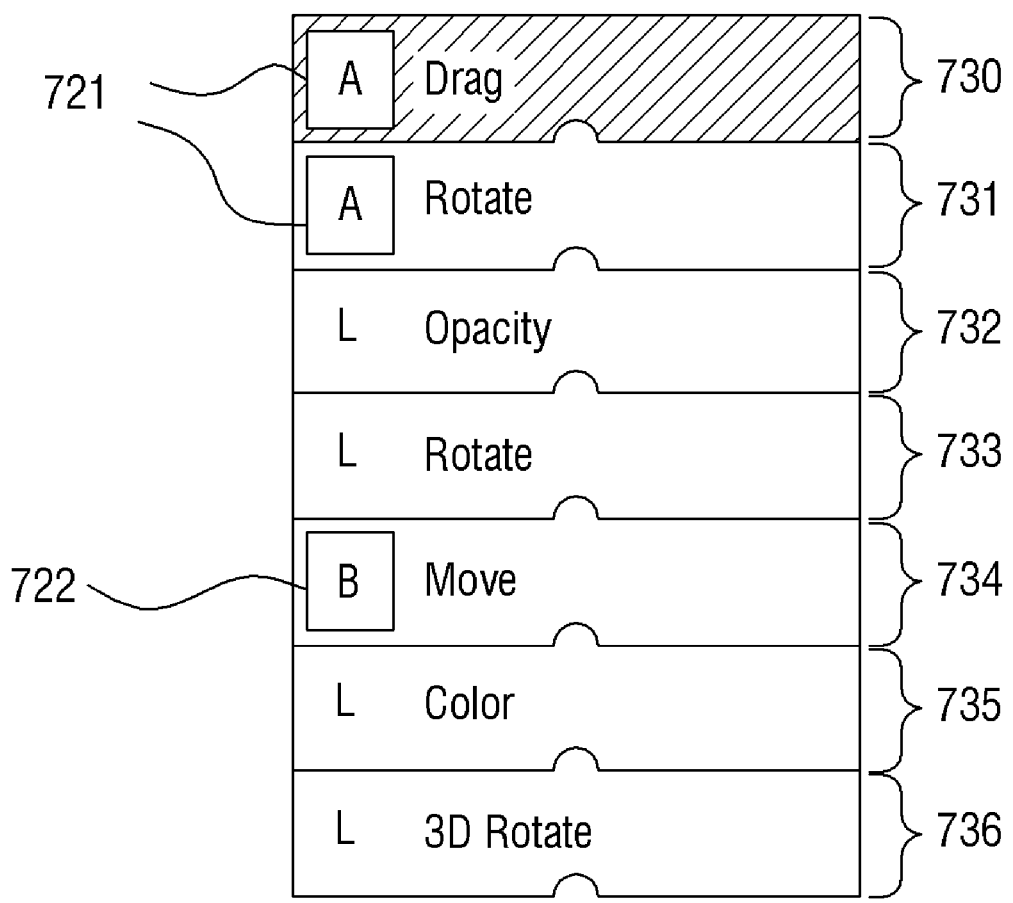

FIGS. 6A, 6B and 7 illustrate a configuration for defining an interaction for allowing an action associated with a predetermined object to be performed when a trigger associated with a predetermined object occurs, according to an embodiment of the present disclosure.

Referring to FIG. 6A, the user may select one of the first graphic element, the second graphic element and the third graphic element corresponding to a trigger, an object and an action, respectively, through the graphic user interface. The selected graphic element can be dragged and dropped to a predetermined layer. Graphic elements dragged and dropped to the predetermined layer can be combined, as shown in FIG. 6B. Thus, prototyping the interaction according to the intention of the user can be performed.

Referring to FIG. 7, it illustrates a set of graphic elements in which a first graphic element 710, second graphic elements 721 and 722, and third graphical elements 731 to 736 are displayed in a combined state. This set of graphic elements may refer to an interaction "when a trigger (Drag 710) for dragging a photo object 721 occurs, actions of Rotate 731, Opacity 732 and Scale 733 are performed on the photo object 721 and actions of Move 734, Color 735 and 3D Rotate 736 are performed on a text box object 722."

FIGS. 8A, 8B, 9A and 9B are diagrams illustrating a relationship between a combined state of graphic elements and an interaction corresponding thereto according to an embodiment of the present disclosure.

Figure 8B:
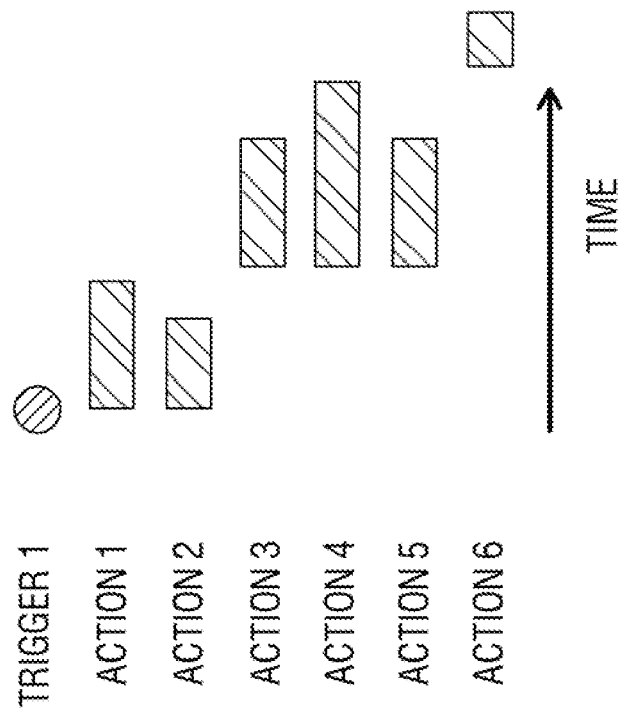
FIGS. 8A, 8B, 9A and 9B are diagrams illustrating a relationship between a combined state of graphic elements and an interaction corresponding thereto according to an embodiment of the present disclosure.
Figure 8A:
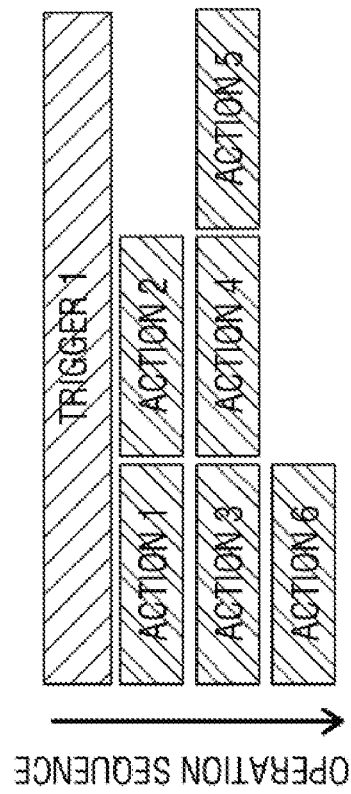

Referring to FIGS. 8A and 8B, the first graphic element corresponding to a trigger, the second graphic element corresponding to an object and the third graphical element corresponding to an action may be combined in the order of operations (or actions) on a two-dimensional plane. In the embodiment of FIGS. 8A and 8B, it may be assumed that the operation sequence is determined in the order from top to bottom with respect to a vertical axis (that is, a Y axis) and the graphic elements positioned at the same height on the Y axis are set to operate simultaneously. In this case, the set of graphic elements shown in FIG. 8A may refer to an interaction "when trigger 1 occurs, action 1 and action 2 are first performed simultaneously, then action 3, action 4 and action 5 are performed simultaneously, and then action 6 is performed" (see FIG. 8B).

Figure 9B:
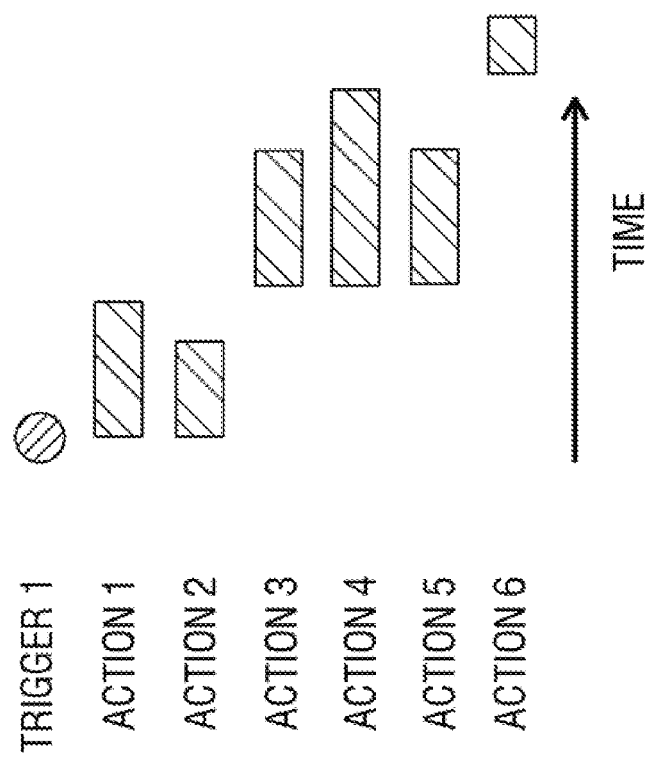
Figure 9A:
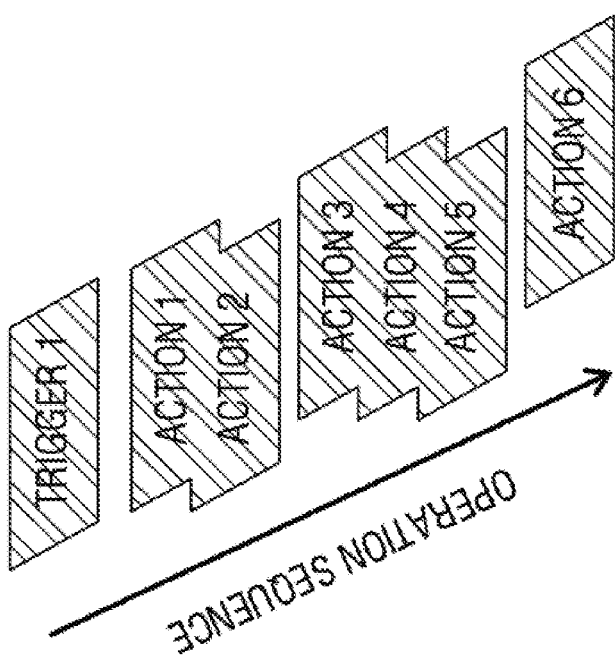

Referring to FIGS. 9A and 9B, similarly to the embodiment of FIGS. 8A and 8B, the first graphic element corresponding to a trigger, the second graphic element corresponding to an object, and the third graphic element corresponding to an action may be combined in the order of operations on the two-dimensional plane. In the embodiment of FIGS. 9A and 9B, it may be assumed that the operation sequence is determined in the order from top to bottom with respect to the vertical axis (i.e., the Y axis), and the graphic elements stacked in a height direction (i.e., a Z axis direction) on the Y axis are set to operate simultaneously. In this case, the set of graphic elements shown in FIG. 9A may refer to an interaction "when trigger 1 occurs, action 1 and action 2 are first performed simultaneously, then action 3, action 4 and action 5 are performed simultaneously, and then action 6 is performed" (see FIG. 9B).

Next, according to an embodiment of the present disclosure, the database 230 may perform a function of storing information about the trigger or interaction defined above, and allowing it to be reused by the user or another user. The database 230 encompasses a computer-readable recording medium, and may refer not only to a database in a narrow sense but also to a database in a broad sense including data records based on a file system or the like.

Next, according to an embodiment of the present disclosure, the communication unit 240 may perform a function of allowing the prototyping tool providing system 200 to communicate with an external device.

Lastly, the control unit 250 according to an embodiment of the present disclosure may perform a function of controlling data flow among the trigger management unit 210, the interaction management unit 220, the database 230 and the communication unit 240. That is, the control unit 250 controls data flow from the outside or among the components of the prototyping tool providing system 200, such that the trigger management unit 210, the interaction management unit 220, the database 230 and the communication unit 240 can carry out their particular functions, respectively.

Examples

Hereinafter, specific examples of an interaction that can be prototyped according to the present disclosure will be described in detail.

FIGS. 10A-10C, 11A-11C, 12A, 12B, 13, 14, 15A, 15B, 16A and 16B illustrate exemplary configurations of an interaction to be prototyped according to an embodiment of the present disclosure.

Figure 10A:
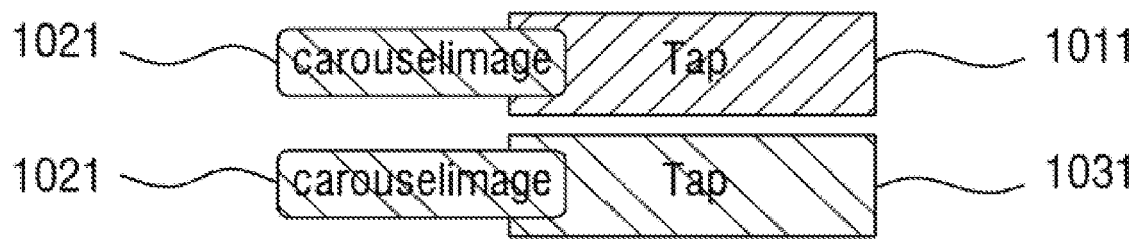
FIGS. 10A-10C, 11A-11C, 12A, 12B, 13, 14, 15A, 15B, 16A and 16B illustrate exemplary configurations of an interaction to be prototyped according to an embodiment of the present disclosure.
Figure 10B:
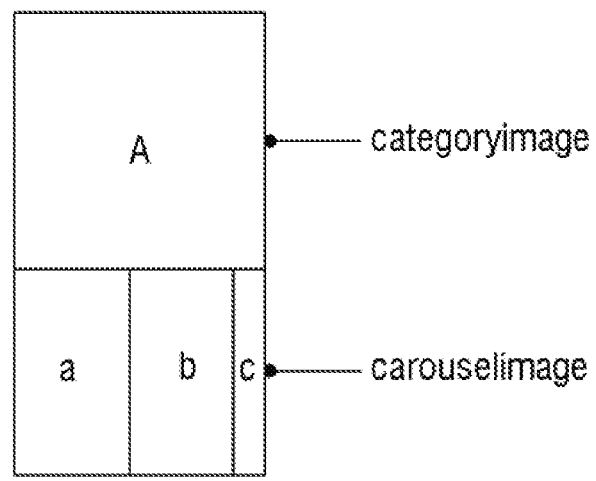
Figure 10C:
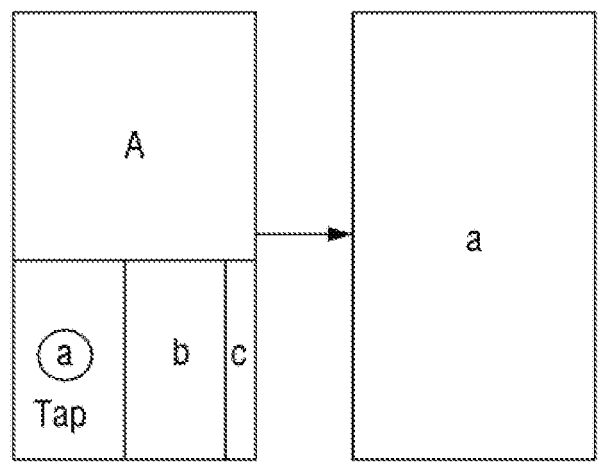

First, referring to FIGS. 10A-10C, according to a set of graphic elements shown in FIG. 10A, an interaction "when a trigger for performing an operation of Tap 1011 on an object called a carousel image 1021 displayed on the screen of the device occurs, an action of Scale 1031 is performed to fill the full screen while the size of the object of the carousel image 1021 increases" may be prototyped (see FIGS. 10B and 10C).

Figure 11A:
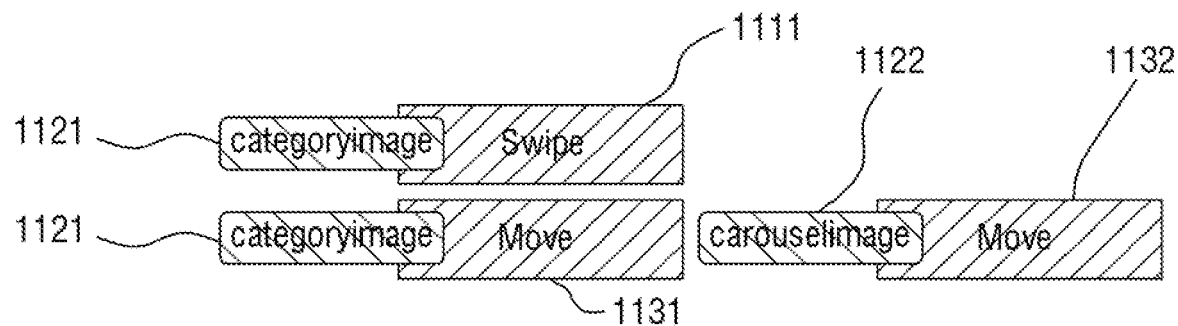
Figure 11B:
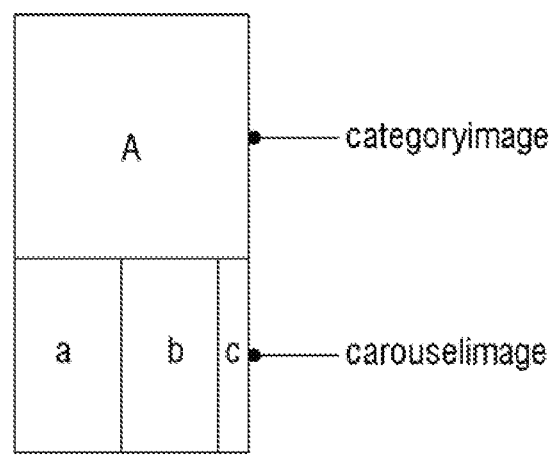
Figure 11C:
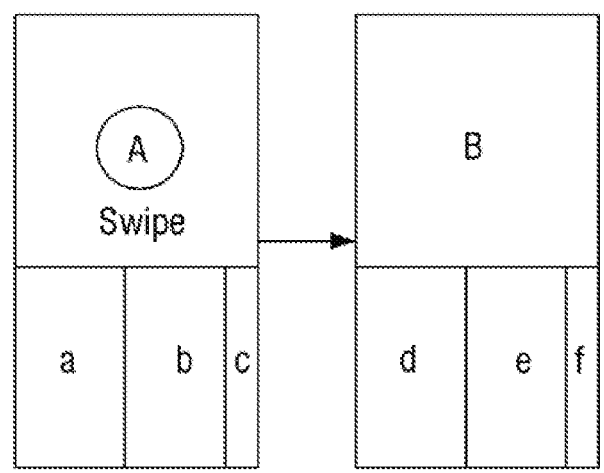

Next, referring to FIGS. 11A-11C, according to a set of graphic elements shown in FIG. 11A, an interaction "when a trigger for performing an operation of Swipe 1111 on an object called a category image 1121 displayed on the screen of the device occurs, an action of Move 1131 is performed to move an object called a category image 1121 and an action of Move 1132 is also performed to move an object called a carousel image 1122 displayed on the screen" may be prototyped (see FIGS. 11B and 11C).

Figure 12A:
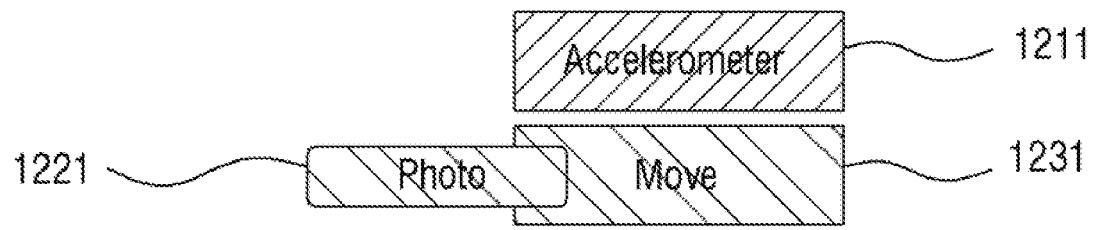
Figure 12B:
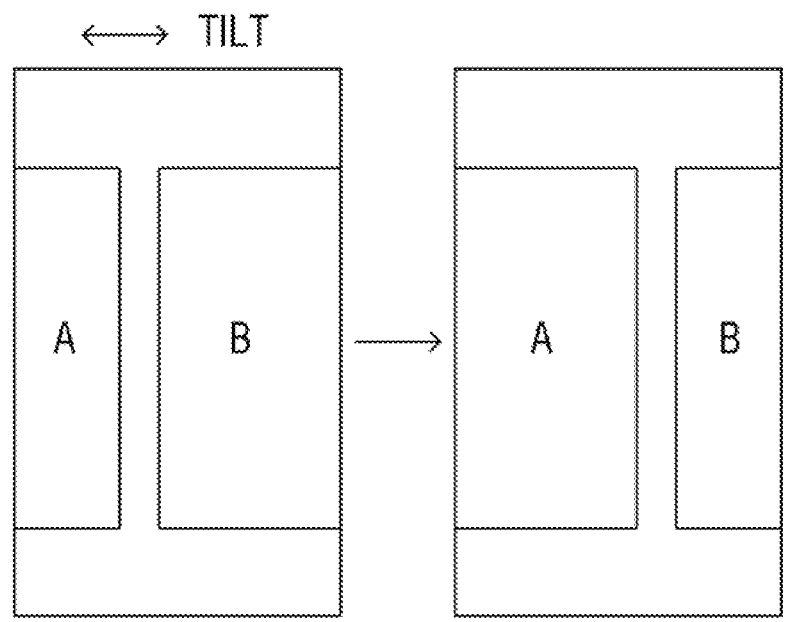

Next, referring to FIGS. 12A and 12B, according to a set of graphic elements shown in FIG. 12A, an interaction "when a trigger for performing an operation of Accelerometer 1211 to tilt the device occurs, an action of Move 1231 is performed to move an object called a photo 1221 displayed on the screen" may be prototyped (see FIG. 12B).

Figure 13:
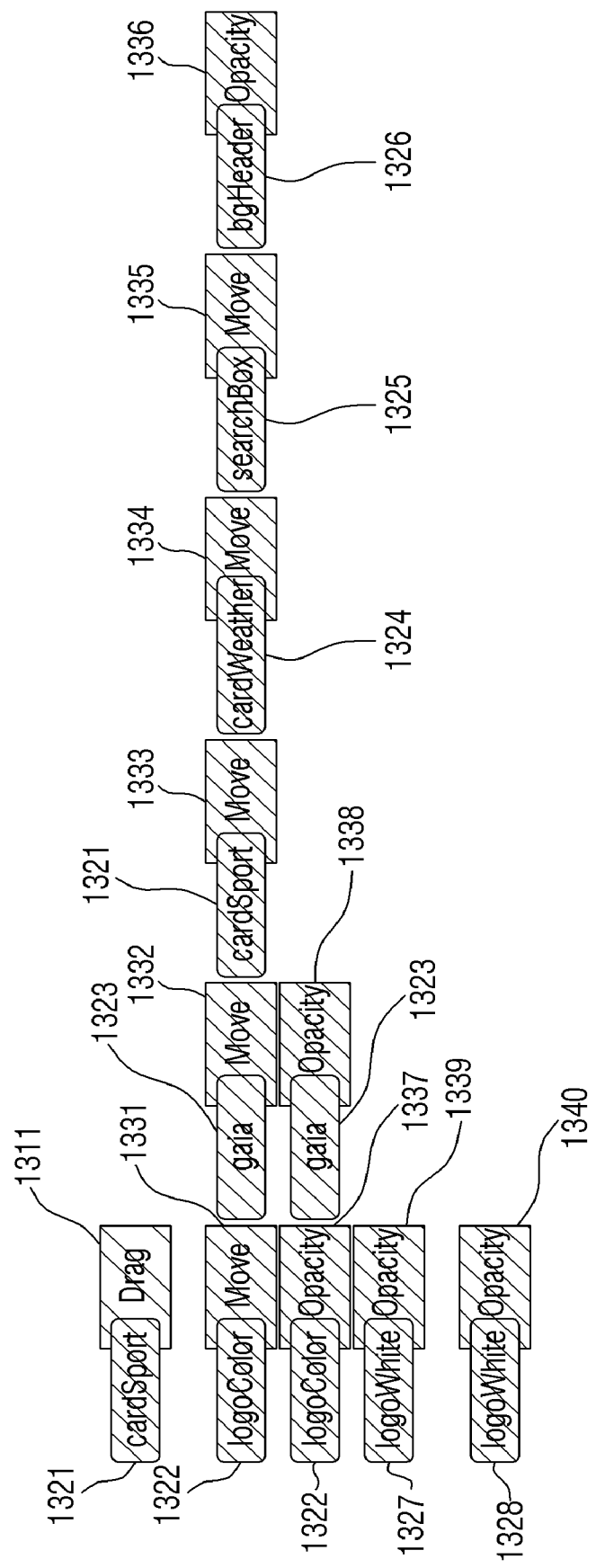
Figure 14:
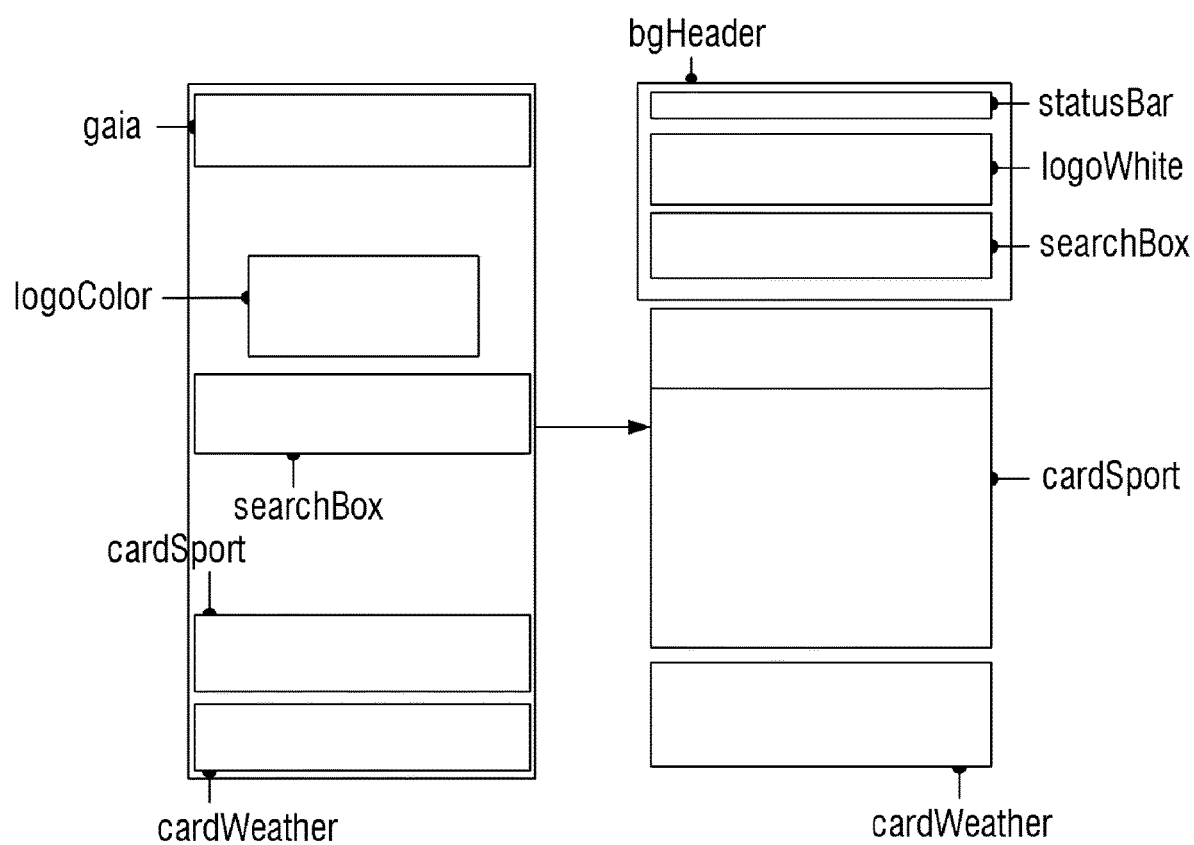

Next, referring to FIGS. 13 and 14, according to a set of graphic elements shown in FIG. 13, an interaction "when a trigger for performing an operation of Drag 1311 (drag upward) on an object called a cardSport area 1321 occurs, an action is first performed to move upward objects called a logoColor area 1322, a gaia area 1323, a cardSport area 1321, a cardWeather area 1324 and a searchBox area 1325 (Move 1331 to 1335), to adjust the opacity of an object called a bgHeader area 1326 (Opacity 1336), and to open and display an object called a cardSport area 1321, an action is then performed to adjust the opacity of objects called a logoColor area 1322 and a gaia area 1323 (Opacity 1337 and 1338), an action is then performed to adjust the opacity of an object called a logoWhite area 1327 (Opacity 1339), and an action is then performed to adjust the opacity of an object called a statusBar area 1328 (Opacity 1340)" may be prototyped (see FIG. 14).

Figure 15A:
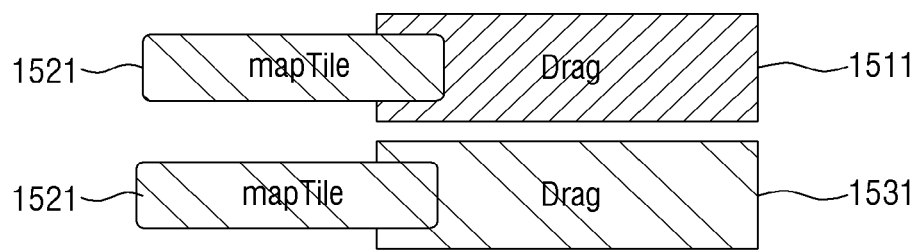
Figure 15B:
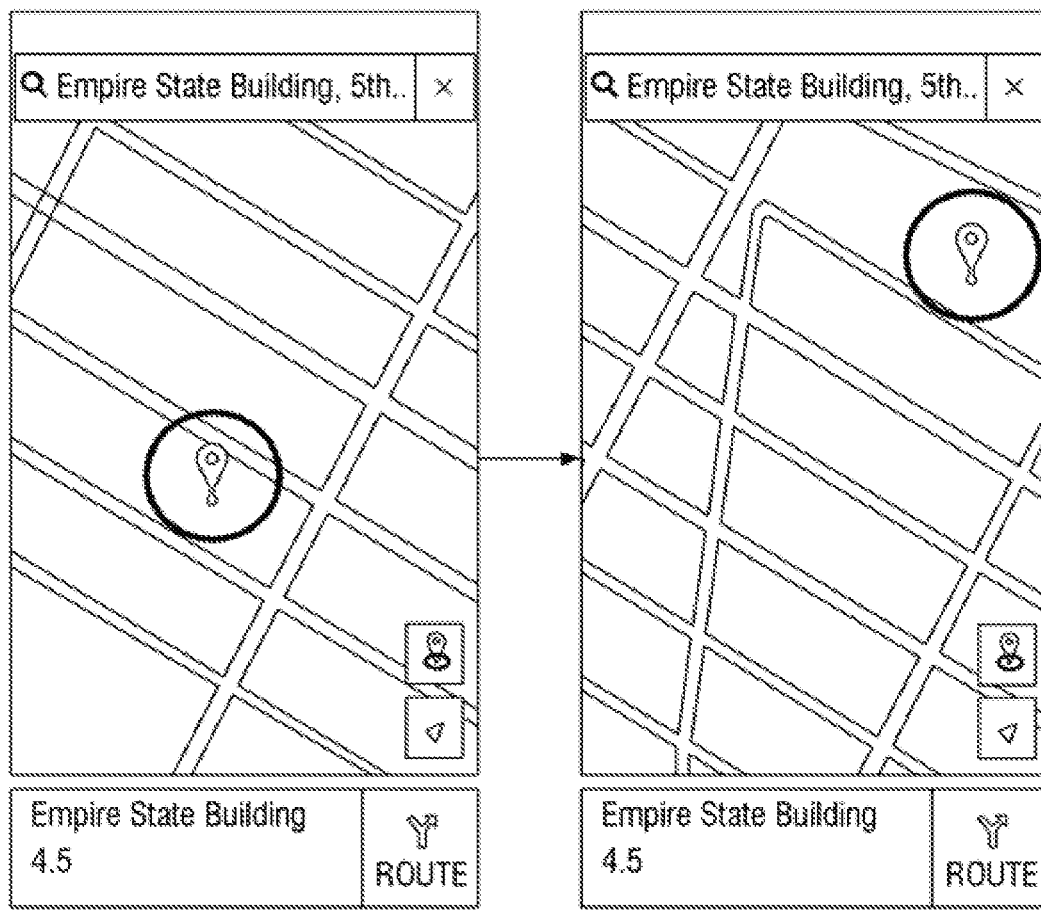

Next, referring to FIGS. 15A and 15B, according to a set of graphic elements shown in FIG. 15A, an interaction "when a trigger for performing an operation of Drag 1511 on an object called mapTile 1521 occurs, an action of Move 1531 is performed to move the object called mapTile 1521" may be prototyped (see FIG. 15B).

Figure 16A:
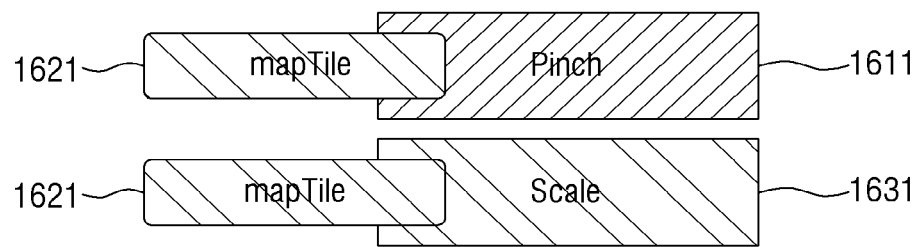
Figure 16B:
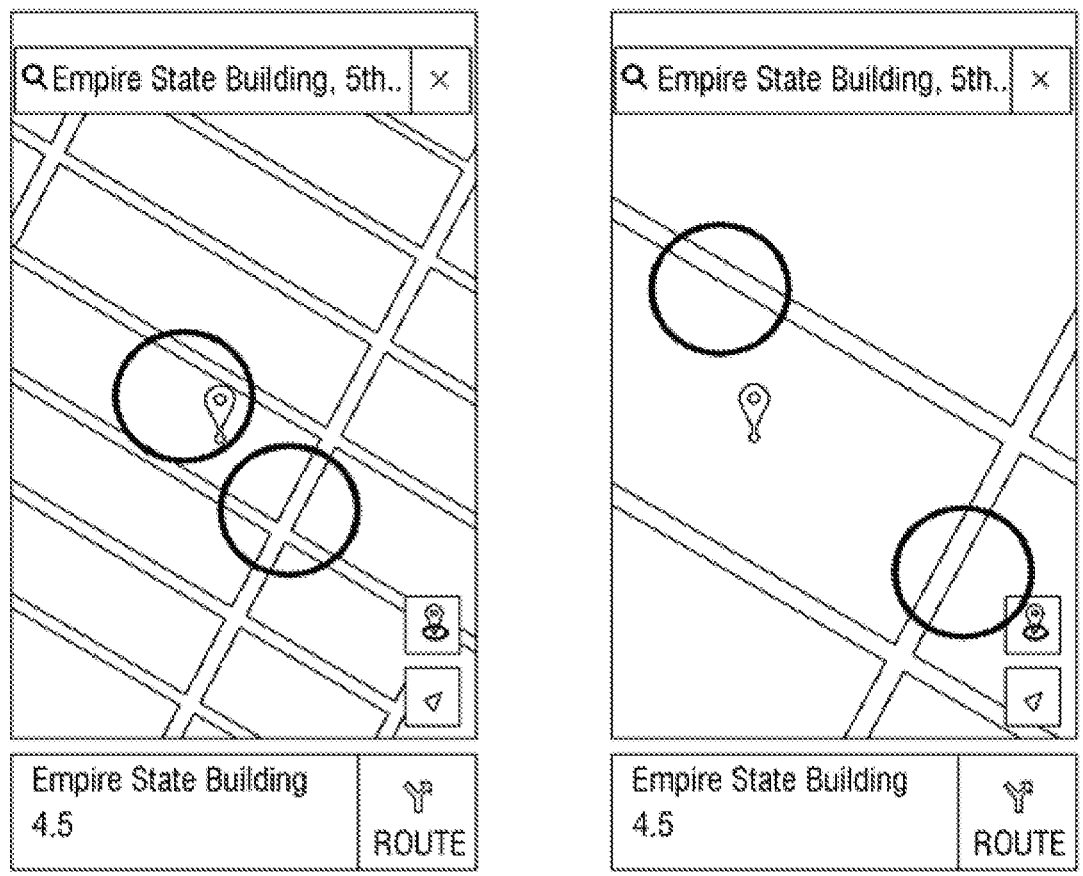

Next, referring to FIGS. 16A and 16B, according to a set of graphic elements shown in FIG. 16A, an interaction "when a trigger for performing an operation of Pinch 1611 on an object called mapTile 1621 occurs, an action of Scale 1631 is performed to enlarge the object called mapTile 1621" may be prototyped (see FIG. 16B).

The embodiments according to the present disclosure as described above may be implemented in the form of program instructions that can be executed by various computer components, and may be stored in a non-transitory computer-readable recording medium. The non-transitory computer-readable recording medium may include program instructions, data files, data structures and the like, separately or in combination. The program instructions stored in the non-transitory computer-readable recording medium may be specially designed and configured for the present disclosure, or may also be known and available to those skilled in the computer software field. Examples of the computer-readable recording medium include the following: magnetic media such as hard disks, floppy disks and magnetic tapes; optical media such as compact disk-read only memory (CD-ROM) and digital versatile disks (DVDs); magneto-optical media such as floptical disks; and hardware devices such as read-only memory (ROM), random access memory (RAM) and flash memory, which are specially configured to store and execute program instructions. Examples of the program instructions include not only machine language codes created by a compiler or the like, but also high-level language codes that can be executed by a computer using an interpreter or the like. The above hardware devices may be changed to one or more software modules to perform the operations of the present disclosure, and vice versa.

Although the present disclosure has been described above in connection with specific limitations such as detailed components as well as limited embodiments and drawings, these are merely provided to aid general understanding of the disclosure. The present disclosure is not limited to the above embodiments, and those skilled in the art will appreciate that various changes and modifications are possible from the above description.

Therefore, the spirit of the present disclosure shall not be limited to the embodiments described above, and the entire scope of the appended claims and their equivalents will fall within the scope and spirit of the disclosure.

What is claimed is:

1. A method for providing a prototyping tool, comprising:
   acquiring input data from a user on a device providing the prototyping tool;
   defining, as a trigger, a gesture based on the input data;
   providing a graphical user interface (GUI) for allowing the user to select a first graphic element, a second graphic element and at least one third graphic element, wherein the first graphic element corresponds to the trigger, the second graphic element corresponds to an object, and the at least one third graphic element corresponding to an action;

receiving, via the GUI, a first user input for selecting the first graphic element, a second user input for selecting the second graphic element, and a third user input for selecting the at least one third graphic element; and defining an interaction between the trigger and the at least one action to be performed with respect to the object in response to the trigger.

2. The method of claim 1, wherein
the acquiring the input data comprises:
detecting a demonstration on the device performed by the user using at least one sensor of the device; and
acquiring data from the at least one sensor.

3. The method of claim 2, wherein
the detecting a demonstration comprises detecting tilting of the device.

4. The method of claim 2, wherein
the detecting a demonstration comprises detecting shaking of the device.

5. The method of claim 2, wherein
the detecting a demonstration comprises detecting tapping on the device.

6. The method of claim 2, wherein
the detecting a demonstration comprises detecting pinching on the device.

7. The method of claim 2, wherein
the detecting a demonstration comprises detecting swiping on the device.

8. The method of claim 2, wherein
the detecting a demonstration comprises detecting dragging on the device.

9. The method of claim 1, wherein
each of the first graphic element, the second graphic element and the at least one third graphic element is formed into a piece of a jigsaw puzzle, and
the method further comprises receiving the fourth user input for putting each piece of the jigsaw puzzle together.

10. The method of claim 9, wherein
the first graphic element is formed into a shape as to be connected to another graphic element only downward and the receiving the fourth user input comprises receiving a user input for disposing the first graphic element on top of the set of graphic elements.

11. The method of claim 9, wherein
the second graphic element is formed into a shape as to at least partially overlap with the first graphic element and the receiving the fourth user input comprises receiving a user input for disposing the second graphic element partially overlapped on the first graphic element.

12. The method of claim 9, wherein
the second graphic element is formed into a shape as to at least partially overlap with the at least one third graphic element and the receiving the fourth user input comprises receiving a user input for disposing the second graphic element partially overlapped on the at least one third graphic element.

13. The method of claim 1, wherein
the defining the interaction comprises defining the interaction performing actions corresponding to the at least one third graphic element in the order from top to bottom with respect to the vertical axis of the at least one third graphic element.

14. The method of claim 1, wherein
the defining the interaction comprises defining the interaction performing actions corresponding to the graphic elements stacked in a height direction on the Y axis simultaneously.

15. A non-transitory computer readable medium storing a computer program causing a computer to provide a prototyping tool, the computer program comprising:
an instruction of acquiring input data from a user on a device providing the prototyping tool;
an instruction of defining, as a trigger, a gesture generated based on the input data;
an instruction of providing a graphical user interface (GUI) for allowing the user to select a first graphic element, a second graphic element and at least one third graphic element, wherein the first graphic element corresponds to the trigger, the second graphic element corresponds to an object, and the at least one third graphic element corresponding to an action;
an instruction of receiving, via the GUI, a first user input for selecting the first graphic element, a second user input for selecting the second graphic element, and a third user input for selecting the at least one third graphic element; and
an instruction of defining an interaction between the trigger and the at least one action to be performed with respect to the object in response to the trigger.

16. The non-transitory computer readable medium method of claim 15, wherein
the instruction of the acquiring the input data comprises:
an instruction of detecting a demonstration on the device performed by the user using at least one sensor of the device; and
an instruction of acquiring data from the at least one sensor.

17. The non-transitory computer readable medium method of claim 15, wherein
each of the first graphic element, the second graphic element and the at least one third graphic element is formed into a piece of a jigsaw puzzle, and
the computer program further comprises the instruction of the receiving the fourth user input for putting each piece of the jigsaw puzzle together.

* * * * *